United States Patent
Hsieh et al.

(10) Patent No.: US 6,638,664 B2
(45) Date of Patent: Oct. 28, 2003

(54) OPTICAL MASK CORRECTION METHOD

(75) Inventors: Chang-Jyh Hsieh, Hsinchu (TW);
Jiunn-Ren Hwang, Hsinchu (TW);
Kuei-Chun Hung, Hsinchu (TW);
Chien-Ming Wang, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 94 days.

(21) Appl. No.: 09/954,933

(22) Filed: Sep. 18, 2001

(65) Prior Publication Data
US 2002/0182550 A1 Dec. 5, 2002

(30) Foreign Application Priority Data
May 30, 2001 (TW) .......................................... 90112993 A

(51) Int. Cl.$^7$ ................................................. G03F 9/00
(52) U.S. Cl. ........................................... 430/5; 430/327
(58) Field of Search ............................. 430/311, 30, 5, 430/327

(56) References Cited

U.S. PATENT DOCUMENTS

| 6,165,693 | A  | * | 12/2000 | Lin ............................ 430/311 |
| 6,413,683 | B1 | * | 7/2002 | Liebman ........................ 430/5 |
| 6,482,559 | B2 | * | 11/2002 | Lin .............................. 430/30 |

* cited by examiner

Primary Examiner—Kathleen Duda
(74) Attorney, Agent, or Firm—Charles C. H. Wu; Wu & Cheung, LLP

(57) ABSTRACT

A method of correcting an optical mask pattern. A third pattern having a first strip-like pattern and a second strip-like pattern is provided. The first strip-like pattern attaches to the mid-section of the second strip-like pattern. A first modification step is conducted. A pair of assistant patterns is added to the respective sides of the first strip-like pattern to form a first modified pattern. A second modification step is conducted to shrink a portion of the first strip-like pattern to form a second modified pattern. Dimension in the reduced portion of the first strip-like pattern is a critical dimension of a main pattern. A third modification step is conducted using an optical proximity correction method. The second modified pattern is modified to a third modified pattern.

7 Claims, 4 Drawing Sheets

OPTICAL MASK CORRECTION METHOD

CROSS-REFERENCE TO RELATED APPLICATION

This application claims the priority benefit of Taiwan application serial No. 90112993, filed May 30, 2001.

BACKGROUND OF THE INVENTION

1. Field of Invention

The present invention relates to a photolithographic process. More particularly, the present invention relates to a method of correcting an optical mask pattern.

2. Description of Related Art

As the level of integration of integrated circuit continues to increase, size of all semiconductor devices shrinks correspondingly. Photolithography is an important process in semiconductor fabrication. Any processes related to the fabrication of metaloxide-semiconductor (MOS) device such as the patterning of various film layers and the doping of substrate demand photolithography. To produce devices having ever-decreasing dimensions, an optical mask of ever-increasing resolution have been developed. Methods capable of increasing mask resolution include optical proximity correction (OPC) and phase shifting.

Optical proximity correction is a method for eliminating deviations in the critical dimensions of a device due to a proximity effect. The proximity effect occurs when a light beam is projected onto a photomask having a pattern thereon. Due to a diffraction of the light beam, the light beam diverges and spreads a little. In addition, a portion of the light beam passing through the photoresist layer on a silicon chip may be reflected back by the semiconductor substrate causing some light interference. Hence, multiple exposure of photoresist may occur, leading to over-exposure of photoresist in part of the pattern.

FIGS. 1A through 1D are schematic top views showing the progression of steps for correcting a mask pattern according to a conventional method. As shown in FIGS. 1A and 1B, a T-shaped original pattern 106 that includes a first strip-like pattern 102 and a second strip-like pattern 104 is provided. A gate-shrinking step is conducted such that a portion of the first strip-like pattern 102 is reduced to form a first modified pattern 110. The reduced portion of the first strip-like pattern 102 is used for patterning the gate portion in an active region. Hence, the reduced dimension of the first strip-like pattern 102 is a critical dimension (CD) of the gate pattern.

As shown in FIG. 1C, a pair of assistant patterns 108 and 109 is added to the respective sides of the first strip-like pattern 102 to form a second modified pattern 112.

As shown in FIG. 1D, an optical proximity correction method is applied to correct the second modified pattern 112 into a third modified pattern 114.

In a conventional mask correction method, the assistant patterns are added after the gate pattern is reduced. Since file size of the third modified pattern 114 is relatively large, considerable time is wasted in writing and inspecting the mask pattern data.

FIG. 2 is a top view showing a photoresist pattern on a photoresist layer after photo-exposure employing a conventional mask correction method. The third modified pattern 114 in FIG. 1D is used to perform a photo-exposure so that the pattern on the photomask is reproduced as a photoresist pattern 202 in the photoresist layer 200. As shown in FIG. 2, the exposed pattern 202 has a pair of necking points 204. The pair of necking points exist due to a discontinuity between the assistant patterns 108 and 109.

SUMMARY OF THE INVENTION

Accordingly, one object of the present invention is to provide a method of correcting an optical mask pattern so that size of file for holding mask pattern data and time for writing and inspecting the file data are reduced.

A second object of this invention is to provide a method of correcting an optical mask pattern so that necking points in exposed pattern resulting from conventional assistant patterns are removed.

A third object of this invention is to provide a method of correcting an optical mask pattern such that resolution of photolithographic process is increased and non-uniformity of post-exposure critical dimensions of devices is improved.

To achieve these and other advantages and in accordance with the purpose of the invention, as embodied and broadly described herein, the invention provides a method of correcting an optical mask pattern. First, a T-shaped original pattern having a first strip-like pattern and a second strip-like pattern is provided. The first strip-like pattern is attached to the mid-section of the second strip-like pattern. A first modification step is conducted. A pair of assistant patterns is added to the respective sides of the first strip-like pattern to form a first modified pattern. Thereafter, a second modification step is conducted to shrink a portion of the first strip-like pattern to form a second modified pattern. Dimension in the reduced portion of the first strip-like pattern is a critical dimension of a main pattern. A third modification step is conducted using an optical proximity correction method. The second modified pattern is modified to a third modified pattern.

In this invention, a pair of assistant patterns is added to the respective sides of the device pattern before shrinking the main pattern. Because only a set of assistant patterns is used instead of two sets for a conventional method, size of file for holding mask pattern data is reduced by half. Hence, time for writing and inspecting file data is reduced considerably. In addition, the method of first adding assistant patterns to the sides of the device pattern before shrinking the main pattern prevents the formation of necking points in the subsequently developed exposed pattern. Furthermore, the optical mask correction method is capable of increasing the resolution of photolithographic process and improving uniformity of critical dimensions in the pattern.

It is to be understood that both the foregoing general description and the following detailed description are exemplary, and are intended to provide further explanations of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
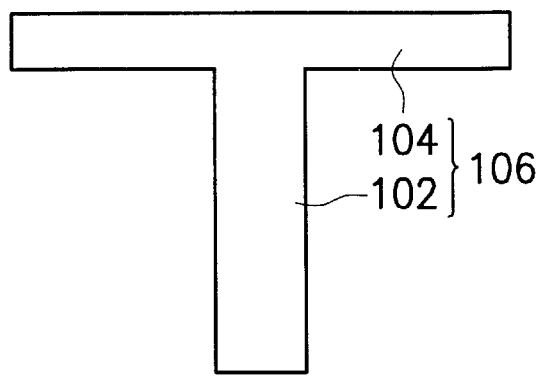
FIGS. 1A through 1D are schematic top views showing the progression of steps for correcting of a mask pattern according to a conventional method.
Figure 1B:
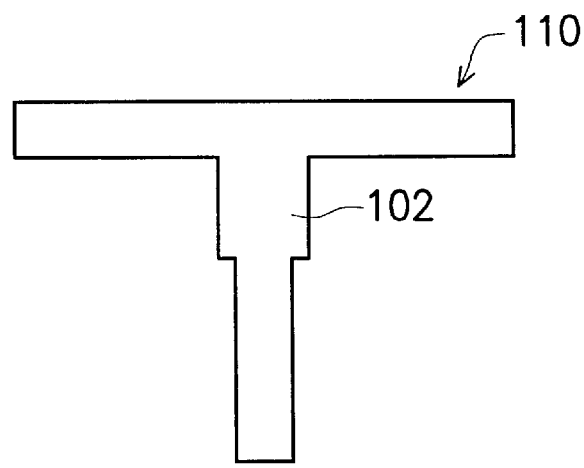
Figure 1C:
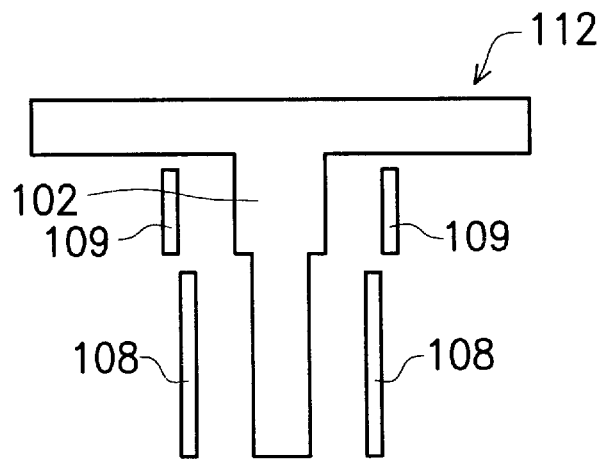
Figure 1D:
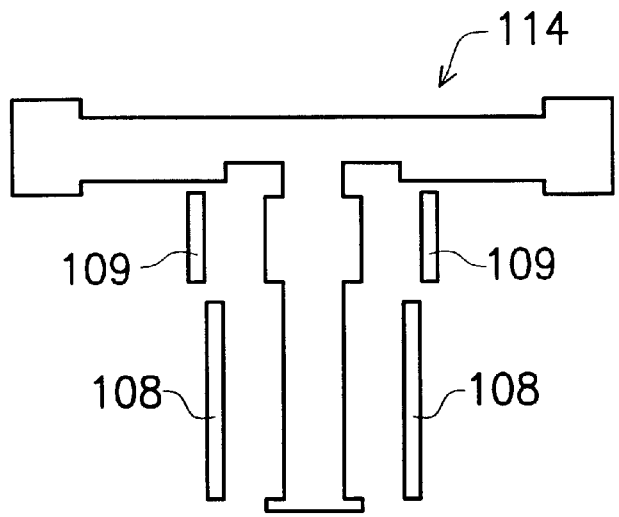
Figure 2:
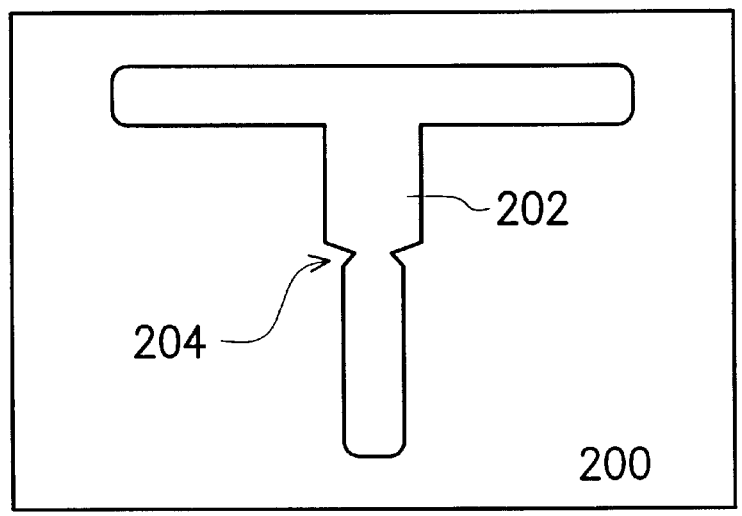
FIG. 2 is a top view showing a photoresist pattern on a photoresist layer after photo-exposure employing a conventional mask correction method.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
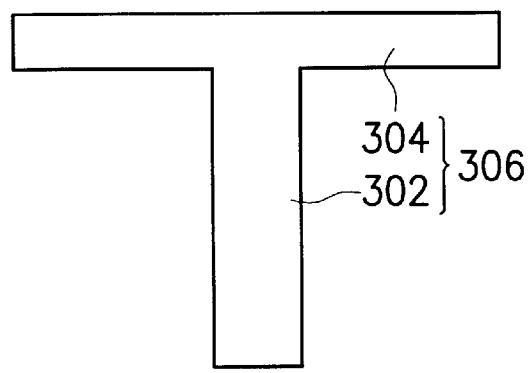
FIGS. 3A through 3D are schematic top views showing the progression of steps for correcting of a mask pattern according to one preferred embodiment of this invention.

FIGS. 3A through 3D are schematic top views showing the progression of steps for correcting of a mask pattern according to one preferred embodiment of this invention. As shown in FIG. 3A, a T-shaped original pattern 306 having a first strip-like pattern 302 and a second strip-like pattern 304 thereon is provided. The first strip-like pattern 302 is attached to the mid-section of the second strip-like pattern 302.

Figure 3B:
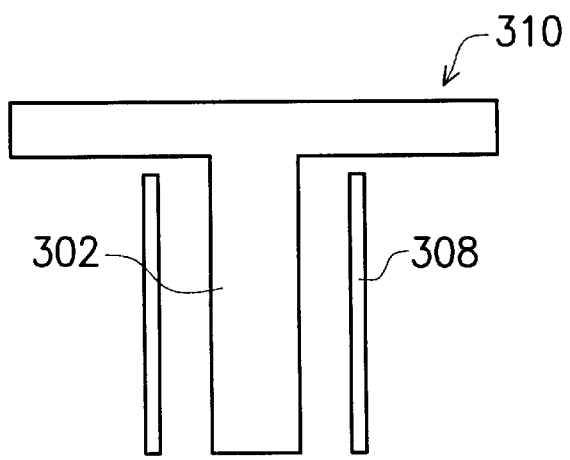

As shown in FIG. 3B, a first modification step is conducted. A pair of assistant patterns 308 is added to the respective sides of the first strip-like pattern 302 to form a first modified pattern 310. The first modified pattern 310 includes the T-shaped original pattern 306 and the assistant patterns 308 and the elements of the pair of assistant patterns 308 are each linear in shape.

Figure 3C:
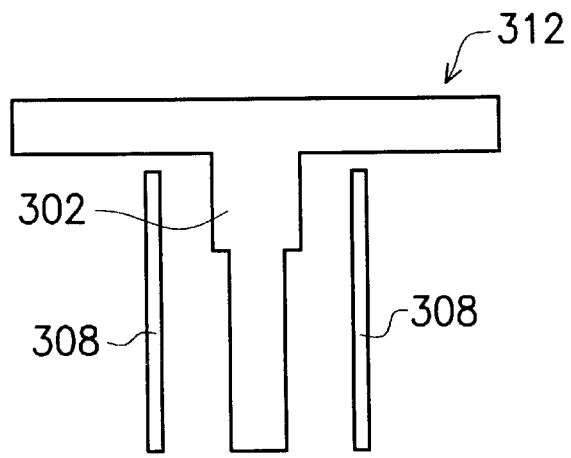

As shown in FIG. 3C, a second modification step is conducted. A portion of the first strip-like pattern 302 is reduced to form a second modified pattern 312. The reduced dimension of the portion of the first strip-like pattern 302 is the critical dimension of a main pattern. For example, the reduced portion of the first strip-like pattern 302 is used to pattern the gate terminal in an active region. The reduced dimension is the critical dimension of the gate pattern.

Figure 3D:
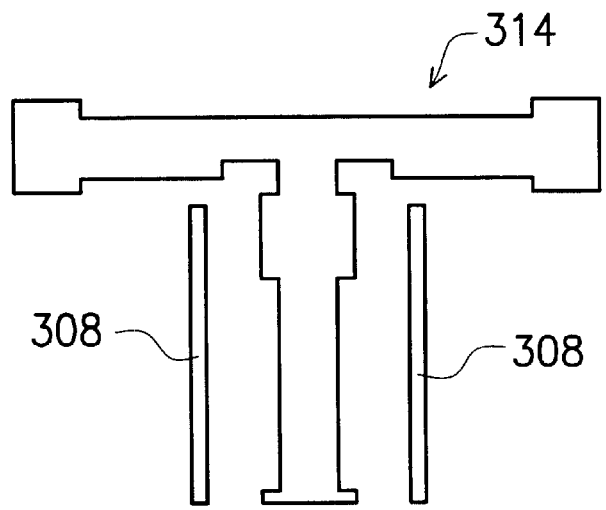

As shown in FIG. 3D, a third modification step is conducted. An optical proximity correction method is used to modify the second modified pattern 312 to form a third modified pattern 314.

In this embodiment, a pair of assistant patterns 308 is added to the respective sides of the first strip-like patterns 302 before shrinking a portion of the first strip-like pattern 302. Since only one set of assistant patterns is used, instead of the two sets used in the conventional method, size of the file for holding optical pattern data is greatly reduced. In addition, size reduction depends on the complexity of the pattern on the mask. According to the device pattern of this embodiment, size of data file can be reduced by 5% to 10%. With such a reduction in file size, time for writing and inspecting pattern data is reduced considerably.

Figure 4:
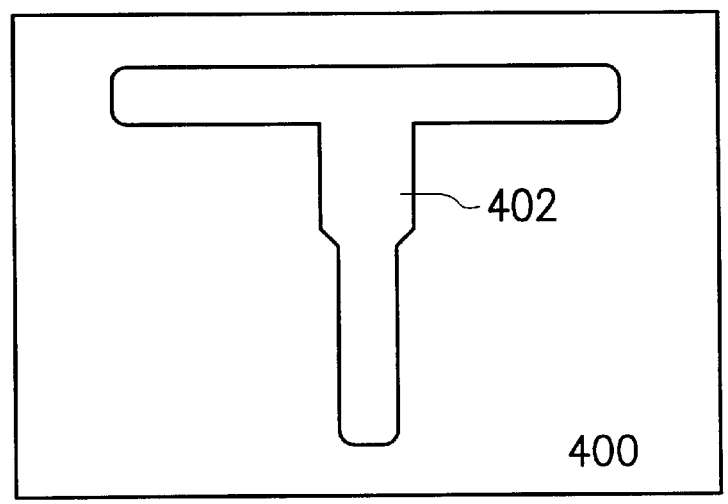
FIGS. 4 is a top view showing a photoresist pattern on a photoresist layer after photo-exposure employing the mask correction method of this invention.

FIGS. 4 is a top view showing a photoresist pattern on a photoresist layer after photo-exposure employing the mask correction method of this invention. As shown in FIG. 4, the third modified pattern 314 in FIG. 3D is used as a photomask for conducting a photo-exposure. The pattern on the photomask is transferred to a photoresist layer 400, thereby forming an exposed pattern 402. In this embodiment, no necking points are formed on the exposed pattern 402.

In conclusion, the advantages of this invention include:
1. A pair of assistant patterns is added to the respective sides of the device pattern before reducing the main pattern.

Because only a set of assistant patterns is used instead of two sets for a conventional method, size of file for holding mask pattern data is reduced by half. Hence, time for writing and inspecting file data is reduced considerably.

2. The method of first adding assistant patterns to the sides of the device pattern before reducing the main pattern prevents the formation of necking points in the subsequently developed exposed pattern.

3. The optical mask correction method is capable of increasing the resolution of photolithographic process and improving uniformity of critical dimensions in the pattern.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of correcting an optical mask pattern, comprising:

providing a third pattern having a first strip pattern and a second strip pattern thereon, wherein the first strip pattern attaches to a mid-section of the second strip pattern;

conducting a first modification to form a first modified pattern by adding a pair of assistant patterns along respective sides of the first strip pattern;

conducting a second modification to form a second modified pattern by shrinking a portion of the first strip pattern, wherein a reduced dimension of the portion of the first strip pattern is a critical dimension of a main pattern; and conducting a third modification to modify the second modified pattern into a third modified pattern by performing an optical proximity correction.

2. The method of claim 1, wherein the main pattern includes a gate pattern.

3. The method of claim 1, wherein each element of the pair of assistant patterns has a strip shape.

4. The method of claim 1, wherein the third pattern includes a T-shaped pattern.

5. A method of correcting the optical mask pattern of a gate and its connection line, comprising:

providing a T-shaped original pattern having a first strip pattern and a second strip pattern thereon, wherein the first strip pattern attaches to the mid-section of the second strip pattern and a portion of the first strip pattern is an original pattern of a gate;

conducting a first modification to form a first modified pattern by adding a pair of assistant patterns long respective sides of the first strip pattern;

shrinking the original gate pattern into a new gate pattern, thereby forming a second modified pattern; and conducting a second modification to modify the second modified pattern into a third modified pattern by performing an optical proximity correction.

6. The method of claim 5, wherein a width of the new gate pattern is a critical dimension.

7. The method of claim 5, wherein each element of the pair of assistant patterns has a strip shape.

* * * * *